United States Patent

Omata et al.

[11] Patent Number: 6,091,095
[45] Date of Patent: Jul. 18, 2000

[54] SEMICONDUCTOR STORAGE

[75] Inventors: Tadahiro Omata; Hidenori Uehara; Yuki Hashimoto; Shinya Takahashi, all of Tokyo, Japan

[73] Assignee: Oki Electric Industry Co., Ltd., Tokyo, Japan

[21] Appl. No.: 09/362,550

[22] Filed: Jul. 28, 1999

[30] Foreign Application Priority Data

Jul. 30, 1998 [JP] Japan .................................. 10-215554

[51] Int. Cl.⁷ .................................................. H01L 27/08
[52] U.S. Cl. .......................................... 257/296; 257/300
[58] Field of Search .................................... 257/296, 300; 365/205, 207, 208

[56] References Cited

U.S. PATENT DOCUMENTS 5,555,519  9/1996  Takashima et al. ..................... 257/296
5,917,211  6/1999  Murata et al. ........................... 257/296

*Primary Examiner*—Thong Phan
*Attorney, Agent, or Firm*—Jones Volentine, LLP

[57] ABSTRACT

A sense amplifier for amplifying the potential difference between paired bit lines has a first transistor having the drain thereof connected to a bit line BL and the gate thereof connected to a bit line /BL, a second transistor having the drain thereof connected to the bit line /BL and the gate thereof connected to the bit line BL, and a third transistor and a fourth transistor provided in association with the first and second transistors, an identical sense amplifier actuating signal being applied to the gates thereof.

12 Claims, 4 Drawing Sheets

SEMICONDUCTOR STORAGE

BACKGROUND OF THE INVENTION

1. Field of the Invention

The present invention relates to a semiconductor storage and, more particularly, to a layout of a sense amplifier of a semiconductor storage.

2. Description of the Related Art

A sense amplifier of a semiconductor storage is connected to a pair of bit lines to which a memory cell is connected and it functions to amplify a minute potential difference produced between the paired bit lines as data stored in the memory cell in the form of an amount of electric charges is supplied to the paired bit lines.

An example of the sense amplifier is formed of a first n-type MOS transistor having the drain thereof connected to one of the pair of bit lines and the gate thereof connected to the other of the pair of bit lines, a second n-type MOS transistor having the drain thereof connected to the other of the pair of bit lines and the gate thereof connected to one of the pair of bit lines, a third n-type MOS transistor having the drain thereof connected to the sources of the first and second MOS transistors, a first sense amplifier actuating signal being supplied to the gate thereof, and a ground potential being supplied to the source thereof, a first p-type MOS transistor having the drain thereof connected to one of the pair of bit lines and the gate thereof connected to the other of the pair of bit lines, a second p-type MOS transistor having the drain thereof connected to the other of the pair of bit lines and the gate thereof connected to one of the pair of bit lines, and a third p-type MOS transistor having the drain thereof connected to the sources of the first and second MOS transistors, a second sense amplifier actuating signal being supplied to the gate thereof and a power source potential being supplied to the source thereof.

A typical conventional sense amplifier has been designed such that the first n-type MOS transistor and the second n-type MOS transistor share the same characteristics (e.g. gate length/gate width), and the first p-type MOS transistor and the second p-type MOS transistor share the same characteristics.

SUMMARY OF THE INVENTION

An object of the present invention is to provide a layout of a sense amplifier that allows to retain substantially the same speed at which the sense amplifier amplifies the minute potential difference supplied by a memory cell to a pair of bit lines, regardless of the value of data stored in the memory cell.

To this end, a semiconductor storage has a plurality of memory cells, a pair of bit lines which are connected to the plurality of memory cells and which are formed over a semiconductor substrate, a first impurity layer of the first conductive type which is connected to one of the pair of bit lines and which is formed in the semiconductor substrate, a second impurity layer of the first conductive type which is connected to the other of the pair of bit lines and which is formed in the semiconductor substrate, a third impurity layer of the first conductive type formed in the semiconductor substrate, a fourth impurity layer of the first conductive type formed in the semiconductor substrate, a fifth impurity layer of the first conductive type to which a predetermined potential is applied and which is formed in the semiconductor substrate, a sixth impurity layer of the first conductive type to which the predetermined potential is applied and which is formed in the semiconductor substrate, a first conductive layer which is formed on the semiconductor substrate between the first impurity layer and the third impurity layer and which is connected to the other of the pair of bit lines, a second conductive layer which is formed on the semiconductor substrate between the second impurity layer and the fourth impurity layer and which is connected to one of the pair of bit lines, a third conductive layer which is formed over the semiconductor substrate between the third impurity layer and the fifth impurity layer and to which a sense amplifier actuating signal is applied, and a fourth conductive layer which is formed over the semiconductor substrate between the fourth impurity layer and the sixth impurity layer and to which the sense amplifier actuating signal is applied.

DESCRIPTION OF THE PREFERRED EMBODIMENT

Figure 1:
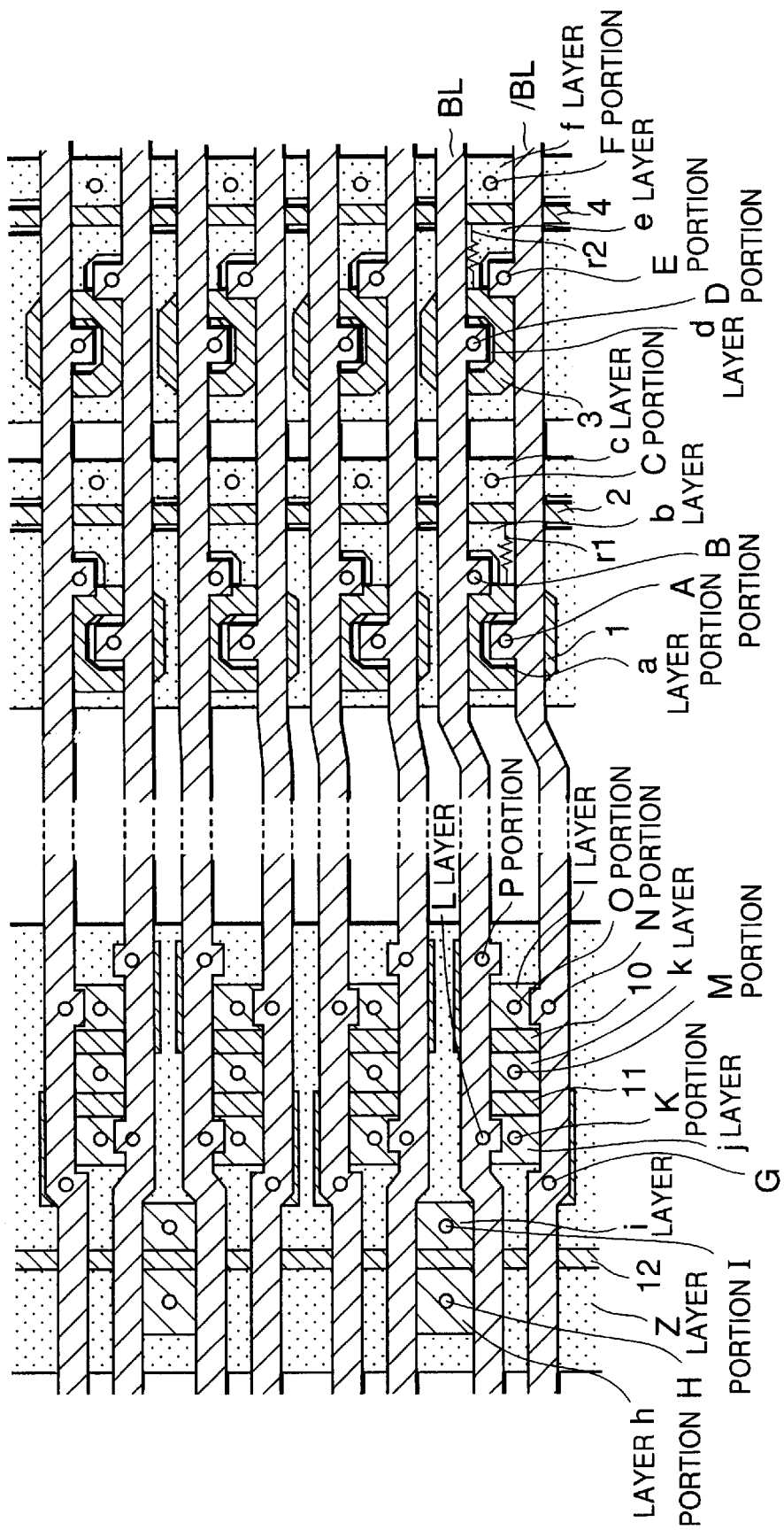
FIG. 1 is a layout diagram showing a sense amplifier according to a first embodiment.
Figure 2:
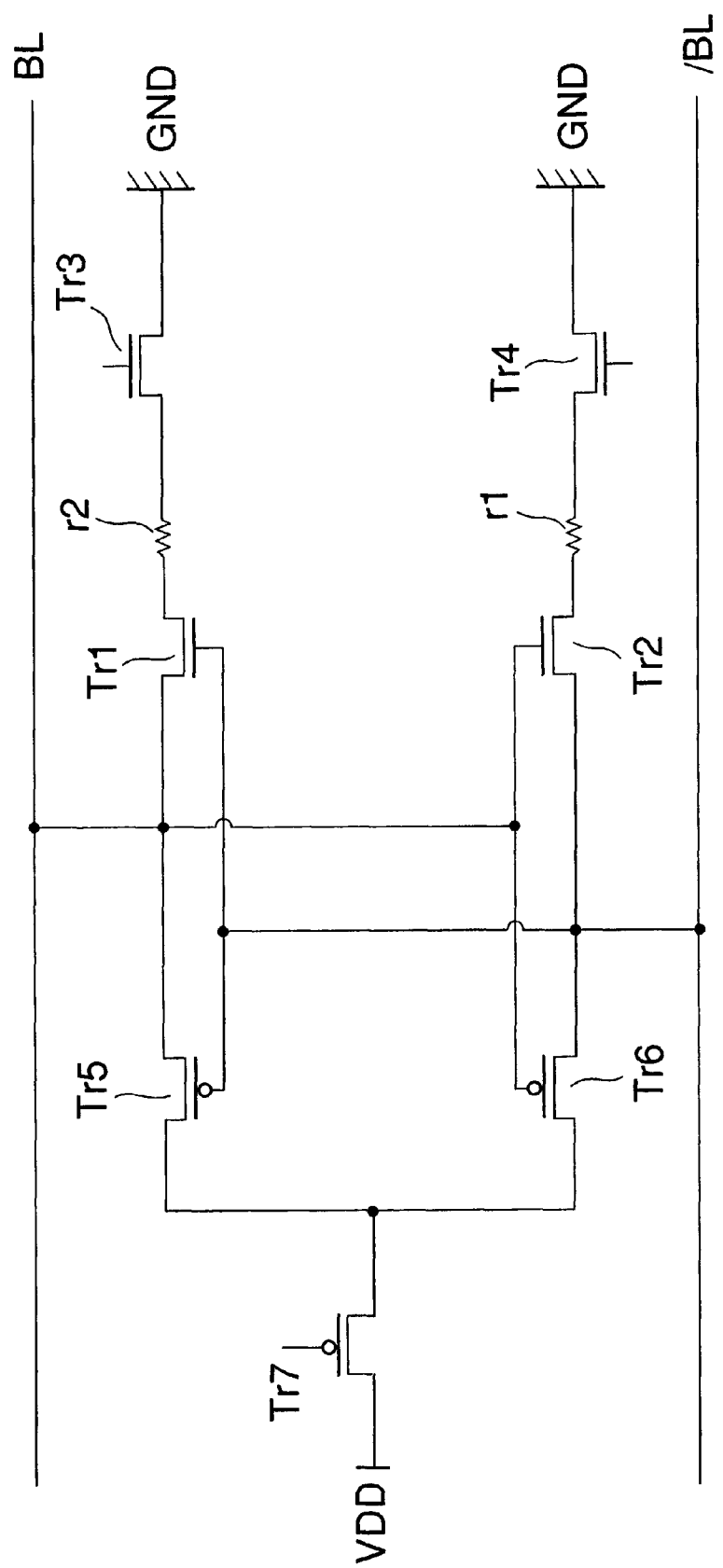
FIG. 2 is a circuit diagram showing the sense amplifier according to the first embodiment.

FIG. 1 is a layout diagram showing a sense amplifier of a first embodiment in accordance with the present invention, and FIG. 2 is a circuit diagram of the sense amplifier of the first embodiment in accordance with the present invention.

Referring to FIGS. 1 and 2, the first embodiment in accordance with the present invention will be described.

First, the circuit configuration of the sense amplifier according to the first embodiment will be described with reference to FIG. 2.

The sense amplifier is formed of a first transistor Tr1 through a fourth transistor Tr4 that are n-type MOS transistors and a fifth transistor Tr5 through a seventh transistor Tr7 that are p-type MOS transistors. The sense amplifier is connected to a pair of bit lines (bit lines BL and /BL).

In the first transistor Tr1, the gate is connected to the bit line /BL, and the drain is connected to the bit line BL. In the third transistor Tr3, the gate receives a first sense amplifier actuating signal, and the drain is connected to the source of the first transistor Tr1 via a parasitic resistor r2, a ground potential GND being applied to the source.

In the second transistor Tr2, the gate is connected to the bit line BL, and the drain is connected to the bit line /BL. In the fourth transistor Tr4, the gate is connected to the gate of the third transistor and receives the first sense amplifier actuating signal, and the drain is connected to the source of the second transistor Tr2 via a parasitic resistor r1, the ground potential GND being applied to the source.

In the fifth transistor Tr5, the gate is connected to the bit line /BL, and the drain is connected to the bit line BL. In the sixth transistor Tr6, the gate is connected to the bit line BL, and the drain is connected to the bit line /BL. In the seventh transistor Tr7, the gate receives a second sense amplifier actuating signal, and the drain is connected to the source of the fifth transistor Tr5 and the source of the sixth transistor Tr6, an internal potential VDD generated internally being applied to the source thereof.

Referring now to FIG. 1, the layout of the sense amplifier of FIG. 2 will be described.

In FIG. 1, a plurality of sense amplifiers related to a plurality of pairs of bit lines (bit lines BL and /BL) connected to a plurality of memory cells, not shown, are respectively disposed. A first transistor Tr1 through a fourth transistor Tr4, which are n-type MOS transistors, of the sense amplifiers are disposed on the right side of the layout, while a fifth transistor Tr5 through a seventh transistor Tr7, which are p-type MOS transistors, of the sense amplifiers are disposed on the left side of the layout.

The gate length/gate width of the first transistor Tr1 and the second transistor Tr2 is set to a smaller value than that of the fifth transistor Tr5 and the sixth transistor Tr6.

First, the layout of the first transistor Tr1 through the fourth transistor Tr4 will be described. It is assumed that the semiconductor substrate constituting the circuit is of a p-type substrate.

The layout includes a conductive layer 1 which is formed over the semiconductor substrate and which serves as the gate of the second transistor Tr2, a sense amplifier actuating line 2 to which a first sense amplifier actuating signal is applied and which serves as the gate of the fourth transistor Tr4, a conductive layer 3 which is formed over the semiconductor substrate and which serves as the gate of the first transistor Tr1, and a sense amplifier actuating line 4 to which the first sense amplifier actuating signal is applied and which serves as the gate of the third transistor Tr3.

An a layer is an n-type impurity layer in the semiconductor substrate and serves as the drain of the second transistor. A b layer is an n-type impurity layer in the semiconductor substrate and serves as the source of the second transistor Tr2 and also serves as the drain of the fourth transistor Tr4. In other words, the b layer functions as the source of the second transistor Tr2 and also as the drain of the fourth transistor Tr4. A c layer is an n-type impurity layer in the semiconductor substrate and serves as the source of the fourth transistor Tr4, a ground potential GND being applied thereto. A d layer is an n-type impurity layer in the semiconductor substrate and serves as the drain of the first transistor Tr1. An e layer is an n-type impurity layer in the semiconductor substrate and serves as the source of the first transistor Tr1 and also as the drain of the third transistor Tr3. In other words, the e layer functions as the source of the first transistor Tr1 and also as the drain of the third transistor Tr3. An f layer is an n-type impurity layer in the semiconductor substrate and serves as the source of the third transistor Tr3, a ground potential being applied thereto.

In an A portion, the bit line /BL and the a layer are connected. In a B portion, the conductive layer 1 and the bit line BL are connected. In a C portion, the ground potential is applied to the c layer. In a D portion, the bit line BL and the d layer are connected. In an E portion, the conductive layer 3 and the bit line /BL are connected. In an F portion, the ground potential is applied to the f layer. The c layer and the e layer are separated by a LOCOS oxide film.

In this case, the length of the b layer between the conductive layer 1 and the sense amplifier actuating line 2 and a parasitic resistor (r1) are configured to be identical to the length of the e layer between the conductive layer 3 and the sense amplifier actuating line 4 and a parasitic resistor (r2).

The layout of the fifth transistor Tr5 through the seventh transistor Tr7 will now be described.

It is assumed that transistors Tr5 through Tr7 are formed in an n-type well Z formed in a p-type semiconductor substrate.

The layout includes a conductive layer 10 which is formed over the semiconductor substrate and serves as the gate of the sixth transistor Tr6, a conductive layer 11 which is formed over the semiconductor substrate and serves as the gate of the fifth transistor Tr5, and a sense amplifier actuating line 12 which receives a second sense amplifier actuating signal and serves as the gate of the seventh transistor Tr7.

A j layer is a p-type impurity layer in the n-type well Z and serves as the drain of the fifth transistor Tr5. A k layer is a p-type impurity layer in the n-type well Z and serves as the source of the fifth transistor Tr5 and also as the source of the sixth transistor Tr6. In other words, the k layer functions as the source of the fifth transistor Tr5 and also as the source of the sixth transistor Tr6. An l layer is a p-type impurity layer in the well Z and serves as the drain of the sixth transistor Tr6.

The i layer is a p-type impurity layer in the well Z and serves as the drain of the seventh transistor Tr7, and an h layer is a p-type impurity layer in the well Z and serves as the source of the seventh transistor.

K and L portions are electrically connected via a conductive layer, not shown, to thereby electrically connect the bit line BL with the j layer. In a G portion, a conductive layer 11 and the bit line /BL are connected. O and N portions are electrically connected via a conductive layer, not shown, to thereby electrically connect the bit line /BL with the l layer. In P portion, a conductive layer 10 and the bit line BL are connected. I and M portions are electrically connected via a conductive layer, not shown, to thereby electrically connect the sources of the fifth transistor Tr5 and the sixth transistor Tr6 and the drain of the seventh transistor Tr7. An internal potential VDD is applied to an H portion.

The operation will now be described.

A case will be described in which data "1" supplied from the memory cell has set the potential of the bit lines BL at ½VDD+ΔV and the potential of the bit lines /BL at ½VDD.

First, the first sense amplifier actuating signal is at an L level, while the second sense amplifier actuating signal is at an H level.

Then, the first sense amplifier actuating signal is switched to the H level, while the second sense amplifier actuating signal is switched to the L level. This causes electrons to move toward the source of the seventh transistor Tr7 to which the internal potential VDD is applied via the bit line BL from the source of the third transistor Tr3 to which the ground potential GND is applied. The electrons also move toward the source of the seventh transistor Tr7 to which the internal potential VDD is applied via the bit line /BL from the source of the fourth transistor Tr4 to which the ground potential GND is applied. In other words, current flows toward the source of the third transistor Tr3 via the bit line BL from the source of the seventh transistor Tr7, and current also flows toward the source of the fourth transistor Tr4 via the bit line /BL from the source of the seventh transistor Tr7.

Immediately after the second sense amplifier actuating signal is set at the L level while the first sense amplifier actuating signal is at the H level, the following relationship holds true:

Gate potential of the second transistor Tr2−Gate potential of the first transistor Tr1=ΔV Gate potential of the sixth transistor Tr6−Gate potential of the fifth transistor Tr5=ΔV Thus, electrons are released from the bit lines BL, and the electrons are supplied to the bit lines /BL.

After a predetermined time passes, the potential of the bit lines BL is set at VDD, while the potential of the bit lines /BL is set at GND.

A case will now be described in which data "0" supplied from the memory cell has set the potential of the bit lines BL at ½VDD and the potential of the bit lines /BL at ½VDD+ ΔV.

First, the first sense amplifier actuating signal is at the L level, while the second sense amplifier actuating signal is at the H level.

Then, the first sense amplifier actuating signal is switched to the H level, while the second sense amplifier actuating signal is switched to the L level. This causes electrons to move toward the source of the seventh transistor Tr7 to which the internal potential VDD is applied via the bit line from the source of the third transistor Tr3 to which the ground potential GND is applied. The electrons also move toward the source of the seventh transistor Tr7 to which the internal potential VDD is applied via the bit line /BL from the source of the fourth transistor Tr4 to which the ground potential GND is applied. In other words, current flows toward the source of the third transistor Tr3 via the bit line BL from the source of the seventh transistor Tr7, and current also flows toward the source of the fourth transistor Tr4 via the bit line /BL from the source of the seventh transistor Tr7.

Immediately after the second sense amplifier actuating signal is set at the L level while the first sense amplifier actuating signal is at the H level, the following relationship holds true:

Gate potential of the first transistor Tr1−Gate potential of the second transistor Tr2=ΔV Gate potential of the fifth transistor Tr5−Gate potential of the sixth transistor Tr6=ΔV Thus, electrons are released from the bit lines /BL, and the electrons are supplied to the bit lines BL.

After a predetermined time passes, the potential of the bit lines /BL is set at VDD, while the potential of the bit lines BL is set at GND.

In the first embodiment, the third transistor and the fourth transistor are provided to match the first transistor and the second transistor. This makes it possible to set the length of the b layer between the conductive layer 1 and the conductive layer 2 so that it is equal to the length of the e layer between the conductive layer 3 and the conductive layer 4. Hence, by setting the length of the b layer between the conductive layer 1 and the conductive layer 2 to the same length of the e layer between the conductive layer 3 and the conductive layer 4, the resistance (a parasitic resistor r1) of the b layer between the conductive layer 1 and the conductive layer 2 becomes equal to the resistance (a parasitic resistor r2) of the e layer between the conductive layer 3 and the conductive layer 4. This means that the parasitic resistor r1 from the source of the first transistor to the drain of the third transistor Tr3 becomes equal to the parasitic resistor r2 from the source of the second transistor Tr2 to the drain of the fourth transistor Tr4. Further, when the characteristics of the first transistor Tr1 and the second transistor Tr2 are made identical and the characteristics of the third transistor Tr3 and the fourth transistor Tr4 are made also identical, the resistance of the current path from the bit lines BL to GND becomes equal to the resistance of the current path from the bit lines /BL to GND.

Therefore, in the first embodiment, whether the data stored in the memory cell is "1" or "0", it is possible to retain the speed at which the minute potential difference ΔV produced in a pair of bit line is amplified.

Thus, the problem in which the speed at which data is read from the memory cells becomes lower can be solved.

Figure 3:
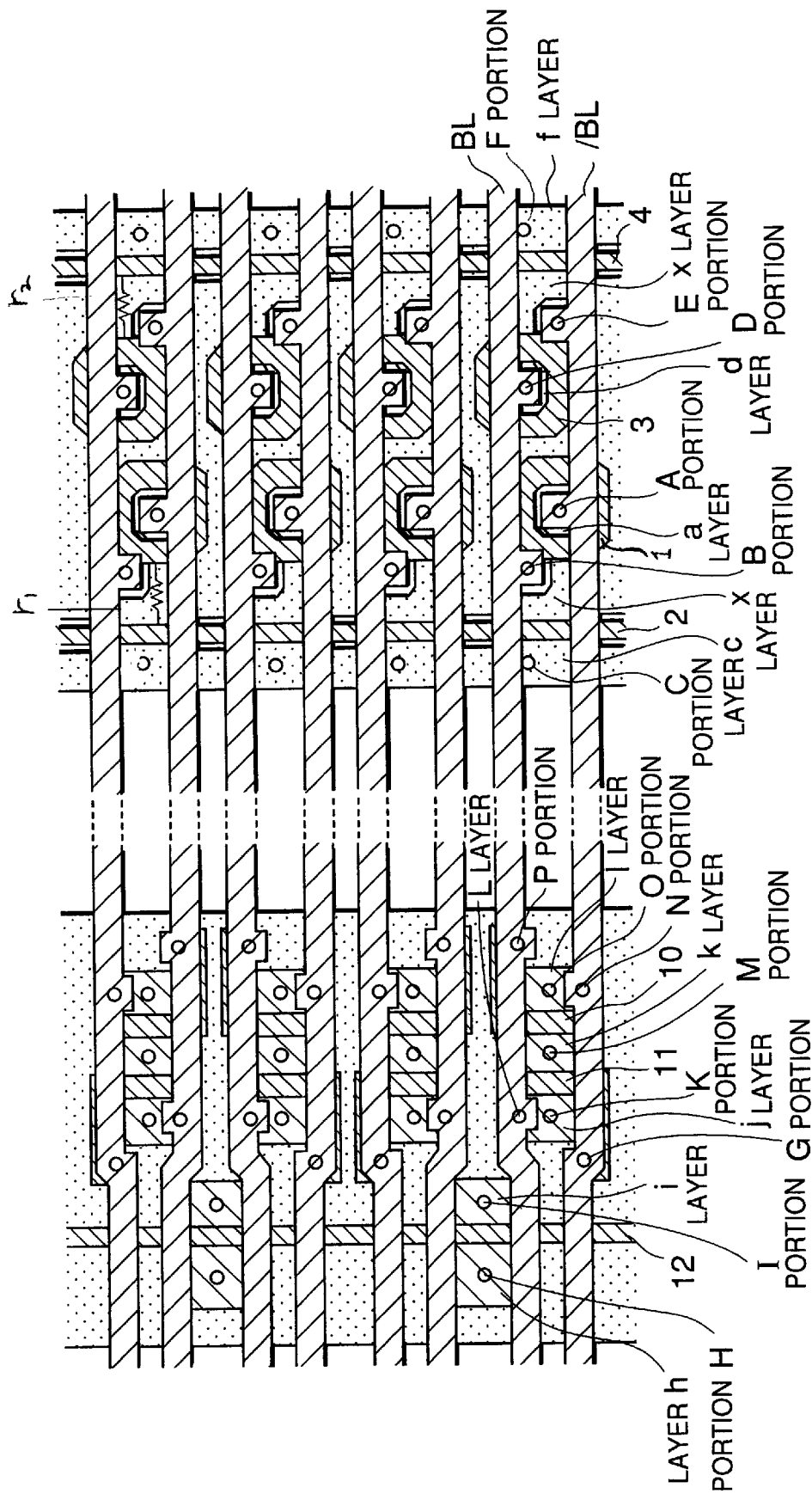
FIG. 3 is a layout diagram showing a sense amplifier according to a second embodiment.
Figure 4:
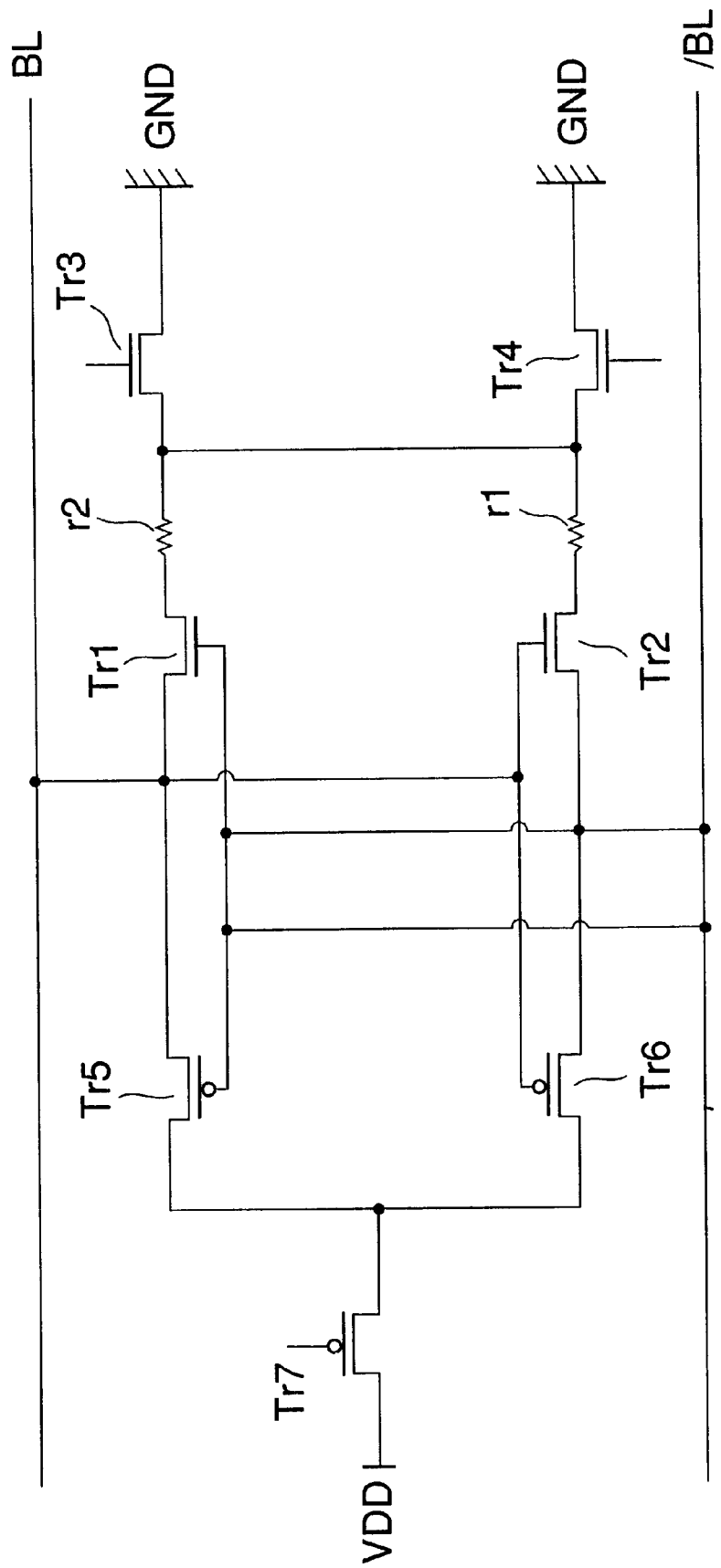
FIG. 4 is a circuit diagram showing the sense amplifier according to the second embodiment.

FIG. 3 is the layout of the sense amplifier of a second embodiment in accordance with the present invention, and FIG. 4 is a circuit diagram of the sense amplifier of the second embodiment in accordance with the present invention.

Referring to FIGS. 3 and 4, the second embodiment in accordance with the present invention will be described.

First, the circuit configuration of the sense amplifier of the second embodiment will be described with reference to FIG. 4.

The sense amplifier is formed of a first transistor Tr1 through a fourth transistor Tr4 that are n-type MOS transistors and a fifth transistor Tr5 through a seventh transistor Tr7 that are p-type MOS transistors. The sense amplifier is connected to a pair of bit lines (bit lines BL and /BL).

In the first transistor Tr1, the gate is connected to the bit line /BL, and the drain is connected to the bit line BL. In the third transistor Tr3, the gate receives a first sense amplifier actuating signal, and the drain is connected to the source of the first transistor Tr1 via a parasitic resistor r2, a ground potential GND being applied to the source.

In the second transistor Tr2, the gate is connected to the bit line BL, and the drain is connected to the bit line /BL. In the fourth transistor Tr4, the gate is connected to the gate of the third transistor and receives the first sense amplifier actuating signal, and the drain is connected to the source of the second transistor Tr2 via a parasitic resistor r1, the ground potential GND being applied to the source. The source of the first transistor and the source of the second transistor are electrically connected.

In the fifth transistor Tr5, the gate is connected to the bit line /BL, and the drain is connected to the bit line BL. The gate of the sixth transistor Tr6 is connected to the bit line BL, and the drain is connected to the bit line /BL. In the seventh transistor Tr7, the gate receives a second sense amplifier actuating signal, and the drain is connected to the source of the fifth transistor Tr5 and the source of the sixth transistor Tr6, an internal potential VDD being applied to the source thereof.

Referring now to FIG. 3, the layout of the sense amplifier of the second embodiment will be described.

This device is formed using a p-type semiconductor substrate.

In FIG. 3, a plurality of sense amplifiers related to a plurality of pairs of bit lines (bit lines BL and /BL) connected to memory cells, not shown, are respectively disposed. A first transistor Tr1 through a fourth transistor Tr4, which are n-type MOS transistors, of the sense amplifiers are disposed on the right side of the layout, while a fifth transistor Tr5 through a seventh transistor Tr7, which are p-type transistors, of the sense amplifiers are disposed on the left side of the layout.

The layout of the fifth transistor Tr5 through the seventh transistor Tr7, which are the p-type transistors, of the sense amplifiers is similar to that of the fifth transistor Tr5 through the seventh transistor Tr7, which are the p-type transistors, of the sense amplifiers in the first embodiment; hence, the description thereof will not be repeated.

The layout of the first transistor Tr1 through the fourth transistor Tr4 will be described.

The layout includes a conductive layer 1 which is formed over the semiconductor substrate and which serves as the gate of the second transistor Tr2, a sense amplifier actuating line 2 to which a first sense amplifier actuating signal is applied and which serves as the gate of the fourth transistor Tr4, a conductive layer 3 which is formed over the semiconductor substrate and which serves as the gate of the first transistor Tr1, and a sense amplifier actuating line 4 to which the first sense amplifier actuating signal is applied and which serves as the gate of the third transistor Tr3.

An a layer Tr2 is an n-type impurity layer in the semiconductor substrate and serves as the drain of the second transistor. An x layer is an n-type impurity layer in the semiconductor substrate and serves as the source of the first transistor Tr1, the source of the second transistor Tr2, the drain of the third transistor Tr3, and the drain of the fourth transistor Tr4. In other words, the x layer functions as the source of the first transistor Tr1, as the source of the second transistor Tr2, as the drain of the third transistor Tr3, and as the drain of the fourth transistor Tr4. A c layer is an n-type impurity layer in the semiconductor substrate and serves as the source of the fourth transistor Tr4, a ground potential GND being applied thereto. A d layer is an n-type impurity layer in the semiconductor substrate and serves as the drain of the first transistor Tr1. An f layer is an n-type impurity layer in the semiconductor substrate and serves as the source of the third transistor Tr3, a ground potential being applied thereto.

In an A portion, the bit line /BL and the a layer are connected. In a B portion, the conductive layer 1 and the bit line BL are connected. In a C portion, the ground potential is applied to the c layer. In a D portion, the bit line BL and the d layer are connected. In an E portion, the conductive layer 3 and the bit line /BL are connected. In an F portion, the ground potential is applied to the f layer.

In this case, the length of the x layer between the conductive layer 1 and the sense amplifier actuating line 2 is equal to the length of the x layer between the conductive layer 3 and the sense amplifier actuating line 4. Thus, the parasitic resistance r1 between the conductive layer 1 and the sense amplifier actuating line 2 becomes equal to the parasitic resistance between the conductive layer 2 and the sense amplifier actuating line 4.

The operation will now be described.

A case will be described in which data "1" supplied from the memory cell has set the potential of the bit lines BL at ½VDD+$\Delta$V and the potential of the bit lines /BL at ½VDD.

First, the first sense amplifier actuating signal is at an L level, while the second sense amplifier actuating signal is at an H level.

Then, the first sense amplifier actuating signal is switched to the H level, while the second sense amplifier actuating signal is switched to the L level. This causes electrons to move toward the source of the seventh transistor Tr7 to which the internal potential VDD is applied via the bit line BL from the source of the third transistor Tr3 to which the ground potential GND is applied. The electrons also move toward the source of the seventh transistor Tr7 to which the internal potential VDD is applied via the bit line /BL from the source of the fourth transistor Tr4 to which the ground potential GND is applied. In other words, current flows toward the source of the third transistor Tr3 via the bit line BL from the source of the seventh transistor Tr7, and current also flows toward the source of the fourth transistor Tr4 via the bit line /BL from the source of the seventh transistor Tr7.

Immediately after the second sense amplifier actuating signal is set at the L level while the first sense amplifier actuating signal is at the H level, the following relationship holds true:

Gate potential of the second transistor Tr2–Gate potential of the first transistor Tr1=$\Delta$V Gate potential of the sixth transistor Tr6–Gate potential of the fifth transistor Tr5=$\Delta$V Thus, electrons are released from the bit lines BL, and the electrons are supplied to the bit lines /BL.

After a predetermined time passes, the potential of the bit lines BL is set at VDD, while the potential of the bit lines /BL is set at GND.

A case will now be described in which data "0" supplied from the memory cell has set the potential of the bit lines BL at ½VDD and the potential of the bit lines /BL at ½VDD+$\Delta$V.

First, the first sense amplifier actuating signal is at the L level, while the second sense amplifier actuating signal is at the H level.

Then, the first sense amplifier actuating signal is switched to the H level, while the second sense amplifier actuating signal is switched to the L level. This causes electrons to move toward the source of the seventh transistor Tr7 to which the internal potential VDD is applied via the bit line BL from the source of the third transistor Tr3 to which the ground potential GND is applied. The electrons also move toward the source of the seventh transistor Tr7 to which the internal potential is applied via the bit line /BL from the source of the fourth transistor Tr4 to which the ground potential GND is applied. In other words, current flows toward the source of the third transistor Tr3 via the bit line BL from the source of the seventh transistor Tr7, and current also flows toward the source of the fourth transistor Tr4 via the bit line /BL from the source of the seventh transistor Tr7.

Immediately after the second sense amplifier actuating signal is set at the L level while the first sense amplifier actuating signal is at the H level, the following relationship holds true:

Gate potential of the first transistor Tr1–Gate potential of the second transistor Tr2=$\Delta$V Gate potential of the fifth transistor Tr5–Gate potential of the sixth transistor Tr6=$\Delta$V Thus, electrons are released from the bit lines /BL, and the electrons are supplied to the bit lines BL.

After a predetermined time passes, the potential of the bit lines /BL is set at VDD, while the potential of the bit lines BL is set at GND.

In the second embodiment, the third transistor and the fourth transistor are provided to match the first transistor Tr1 and the second transistor Tr2. This makes it possible to set the length of the x layer between the conductive layer 1 and the conductive layer 2 so that it is equal to the length of the x layer between the conductive layer 3 and the conductive layer 4. Hence, by setting the length of the x layer between the conductive layer 1 and the conductive layer 2 to the same length of the x layer between the conductive layer 3 and the conductive layer 4, the resistance of the x layer between the conductive layer 1 and the conductive layer 2 becomes equal to the resistance of the x layer between the conductive layer 3 and the conductive layer 4. This means that the parasitic resistor r1 from the source of the first transistor Tr1 to the drain of the third transistor Tr3 becomes equal to the parasitic resistor r2 from the source of the second transistor Tr2 to the drain of the fourth transistor Tr4. Further, the characteristics of the third transistor Tr3 and the fourth transistor Tr4 are identical; hence, the resistance of the current path from the bit lines BL to GND is equal to the resistance of the current path from the bit lines /BL to GND.

Therefore, in the second embodiment, whether the data stored in the memory cell is "1" or "0", it is possible to retain the speed at which the minute potential difference $\Delta$V produced in a pair of bit line is amplified.

Thus, the problem in which the speed at which data is read from the memory cells becomes lower can be solved.

Furthermore, since the x layer serves as the source of the first transistor Tr1, the source of the second transistor Tr2, the drain of the third transistor Tr3, and the drain of the fourth transistor Tr4, the second embodiment has an advantage over the first embodiment in that it requires a smaller area for the devices.

In the first and second embodiments, the resistance of the current path between the bit line BL and the source of the third transistor Tr3 is made equal to the resistance of the current path between the bit line /BL and the source of the fourth transistor Tr4. If the resistance of the current path between the bit line BL and the source of the fifth transistor Tr5 were not equal to the resistance of the current path between the bit line /BL and the source of the sixth transistor Tr6, then making them equal would be further advantageous.

What is claimed is:

1. A semiconductor storage comprising:

a plurality of memory cells;

a pair of bit lines connected to said plural memory cells and which are formed on a semiconductor substrate;

a first impurity layer of the first conductive type connected to one of said pair of bit lines and which is formed in said semiconductor substrate;

a second impurity layer of the first conductive type connected to the other of said pair of bit lines and which is formed in said semiconductor substrate;

a third impurity layer of the first conductive type formed in said semiconductor substrate;

a fourth impurity layer of the first conductive type formed in said semiconductor substrate;

a fifth impurity layer of the first conductive type to which a predetermined potential is applied and which is formed in said semiconductor substrate;

a sixth impurity layer of the first conductive type to which said predetermined potential is applied and which is formed in said semiconductor substrate;

a first conductive layer formed over said semiconductor substrate between said first impurity layer and said third impurity layer and which is connected to the other of said pair of bit lines;

a second conductive layer which is formed over said semiconductor substrate between said second impurity layer and said fourth impurity layer and which is connected to one of said pair of bit lines;

a third conductive layer formed over said semiconductor substrate between said third impurity layer and said fifth impurity layer and to which a sense amplifier actuating signal is applied; and a fourth conductive layer formed over said semiconductor substrate between said fourth impurity layer and said sixth impurity layer and to which said sense amplifier actuating signal is applied.

2. A semiconductor storage according to claim 1, wherein said third impurity layer is formed to surround said first impurity layer, said first conductive layer is formed in a loop shape, said fourth impurity layer is formed to surround said second impurity layer, and said second conductive layer is formed in a loop shape.

3. A semiconductor storage according to claim 1, wherein the length or resistance of said third impurity layer between said first conductive layer and said third conductive layer is substantially equal to the length or resistance of said fourth impurity layer between said second conductive layer and said fourth conductive layer.

4. A semiconductor storage according to claim 1, wherein said third conductive layer and said fourth conductive layer are interconnected.

5. A semiconductor storage according to claim 1, wherein a LOCOS oxide film is formed between said third impurity layer and said fourth impurity layer.

6. A semiconductor storage according to claim 1, wherein said third impurity layer and said fourth impurity layer are formed as the same impurity layers.

7. A semiconductor storage according to claim 7, wherein the resistance between one of said bit lines and said fifth impurity layer is substantially equal to the resistance between the other of said bit lines and said sixth impurity layer.

8. A semiconductor storage comprising:

a plurality of memory cells;

a pair of bit lines connected to said plural memory cells and which are formed over a semiconductor substrate;

a first impurity layer of the first conductive type connected to one of said pair of bit lines and which is formed in said semiconductor substrate;

a second impurity layer of the first conductive type connected to the other of said pair of bit lines and which is formed in said semiconductor substrate;

a third impurity layer of the first conductive type formed in said semiconductor substrate;

a fourth impurity layer of the first conductive type to which a predetermined potential is applied and which is formed in said semiconductor substrate;

a fifth impurity layer of the first conductive type to which said predetermined potential is applied and which is formed in said semiconductor substrate;

a first conductive layer formed over said semiconductor substrate between said first impurity layer and said third impurity layer and which is connected to the other of said pair of bit lines;

a second conductive layer which is formed over said semiconductor substrate between said second impurity layer and said third impurity layer and which is connected to one of said pair of bit lines;

a third conductive layer formed over said semiconductor substrate between said third impurity layer and said fourth impurity layer and to which a sense amplifier actuating signal is applied; and a fourth conductive layer formed over said semiconductor substrate between said third impurity layer and said fifth impurity layer and to which said sense amplifier actuating signal is applied.

9. A semiconductor storage according to claim 8, wherein said third impurity layer is formed to surround said first and second impurity layers, and said first and second conductive layers are formed in a loop shape.

10. A semiconductor storage according to claim 8, wherein the length or resistance of said third impurity layer between said first conductive layer and said third conductive layer is substantially equal to the length or resistance of said third impurity layer between said second conductive layer and said fourth conductive layer.

11. A semiconductor storage according to claim 8, wherein said third conductive layer and said fourth conductive layer are interconnected.

12. A semiconductor storage according to claim 8, wherein the resistance between one of said bit lines and said fourth impurity layer is substantially equal to the resistance between the other of said bit lines and said fifth impurity layer.

* * * * *